(12) United States Patent
Missoni et al.

(10) Patent No.: US 7,960,959 B2
(45) Date of Patent: Jun. 14, 2011

(54) INPUT CURRENT CONTROLLER ARRANGEMENT AND METHOD

(75) Inventors: Albert Missoni, Graz (AT); Christian Klapf, Graz (AT)

(73) Assignees: Infineon Technologies Austria AG, Villach (AT); Technische Universitaet Graz, Graz (AT)

( * ) Notice: Subject to any disclaimer, the term of this patent is extended or adjusted under 35 U.S.C. 154(b) by 821 days.

(21) Appl. No.: 11/685,100

(22) Filed: Mar. 12, 2007

(65) Prior Publication Data
US 2008/0192518 A1 Aug. 14, 2008

(30) Foreign Application Priority Data
Feb. 8, 2007 (DE) .......................... 10 2007 006 347

(51) Int. Cl.
*G05F 1/46* (2006.01)
*G05F 1/54* (2006.01)

(52) U.S. Cl. .......................... 323/312; 323/314; 323/316
(58) Field of Classification Search .................... 363/65, 363/74; 327/103; 323/312, 304, 311–316
See application file for complete search history.

(56) References Cited

U.S. PATENT DOCUMENTS

| 7,166,991 B2 | 1/2007 | Eberlein et al. |
| 2002/0130646 A1* | 9/2002 | Zadeh et al. .................. 323/275 |
| 2006/0261796 A1* | 11/2006 | Park et al. ..................... 323/312 |

* cited by examiner

*Primary Examiner* — Gary L Laxton
*Assistant Examiner* — Nusrat J Quddus
(74) *Attorney, Agent, or Firm* — Dickstein Shapiro LLP.

(57) ABSTRACT

An arrangement having a first converting element configured to convert an input current linearly into an auxiliary current, a second converting element configured to convert the auxiliary current into an output voltage, and a separating element configured to separate slow changes of the auxiliary current from fast changes of the auxiliary current, wherein the first, second, and separating elements are arranged as a dynamic control loop regulating the input current with the slow changes.

28 Claims, 6 Drawing Sheets

INPUT CURRENT CONTROLLER ARRANGEMENT AND METHOD

CROSS-REFERENCE TO RELATED APPLICATION

This application claims priority to German Patent Application Serial No. 102007006347.6, which was filed Feb. 8, 2007, and is incorporated herein by reference in its entirety.

BACKGROUND

A large number of methods are known nowadays for data transmission in digital radio communication systems, RFID systems being one example. In accordance with the particular system, the data transfer takes place between a transponder, implemented, for example as a radio tag, and a reading device. At low communication frequencies, inductive fields provide the transmission medium, while electromagnetic fields are used at higher frequencies. In systems of this type the inductive or electromagnetic field is modulated by information. Modulation consists in a modification of the signal parameters of a carrier frequency, that are the amplitude, the frequency or the phase, in accordance with a modulating signal, known as the baseband signal.

The field has to be demodulated in order to regain the baseband signal, i.e. the real information. Since both the transponder and the reading device contain a source of information, and therefore an exchange of information in both directions takes place, both pieces of equipment often contain both a modulator and a demodulator.

To regain the information, an antenna is now used to extract electrical power from the field. An inductive current arises in the antenna coil as soon as it comes into the region of an electromagnetic field. The modulation of the field is thus converted into the modulation of a proportional electrical current. The information can now be detected in the changes of this current over time. Parallel circuits, also known as shunt circuits, are used to detect the current.

A digital radio communication system involves, amongst other things, a highly dynamic electromagnetic field. In other words, depending on the distance between the transmitting and receiving equipments, the information is transmitted in a form of a highly variable field. The modulated field therefore has a rapidly changing modulation component, representing the information, and a slower component resulting from changes in the distance between the transmitter and receiver, or from changes in the transmission medium.

After converting the field into a proportional current, it is therefore necessary to normalize the current before being able to process the information contained in the current any further, so that subsequent circuit elements are not loaded beyond appropriate limits.

Normalization of this type is referred to as dynamic compression. In the past, one way of achieving dynamic compression has been to use a number of diodes in series. Another way of achieving compression has been to use a specialized analogue/digital converter, in which two demodulation units are provided with variable sensitivity modules, thereby switching between several outputs.

BRIEF DESCRIPTION OF THE DRAWINGS

Examples of the invention are explained below with reference to the drawings; the illustrations have been drawn so that components that are the same, or that have the same effect, are given the same reference. The elements illustrated are not to scale. For the sake of understanding, some elements have been shown disproportionately large or in an extremely simplified form.

DESCRIPTION OF THE INVENTION

Figure 1:
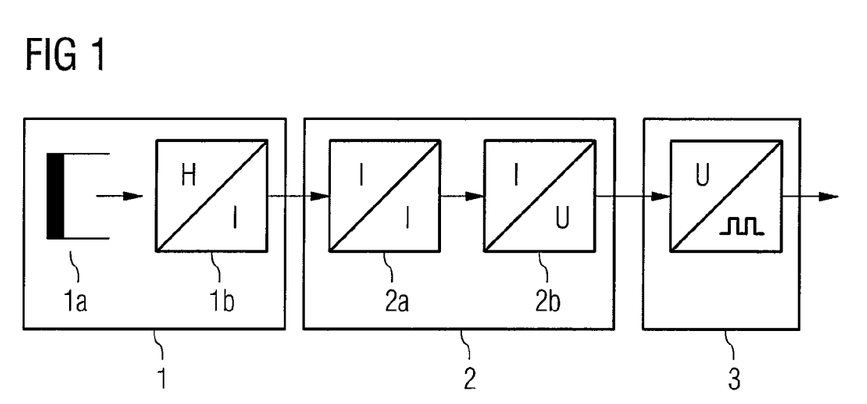
FIG. 1 shows a block diagram of receiving unit in a communication system.

FIG. 1 shows a block diagram of a receiver in a radio communication system, such as might, for instance, be used in RFID systems.

A conversion unit 1, which converts an information modulated electromagnetic field into an electrical current, comprises a receiving unit 1a and a shunt circuit 1b. This shunt circuit might, for instance, be implemented as a parallel circuit. The transmitted information, which is present as a field at the receiving unit 1a, can be converted into rapid changes in electrical current by means, for instance, of a shunt resistor.

As a result of changes in the distance between the transmitter and receiver in this radio communication system, the electromagnetic field that carries the modulated field strength has a further modification superimposed upon it; it is, in other words, also modulated by the changing distance. One of the effects of larger changes in distance is that the field has a wide dynamic range, and this is reflected in a slow change in the current flowing through the shunt element. The changing current, comprising both a slow and a fast component, is now passed to a decoupling unit 2. The modulated current, which will be referred to below as the input current I1, is converted in a linear current converter 2a into an auxiliary current I1', and is fed to a current/voltage converter 2b. An output voltage U1 is present at the output of the decoupling unit 2, which contains a dynamic control loop, and this voltage is passed to a demodulation unit 3. The information is extracted in the demodulation unit 3; the extraction will not be considered here in any more detail.

Figure 2:
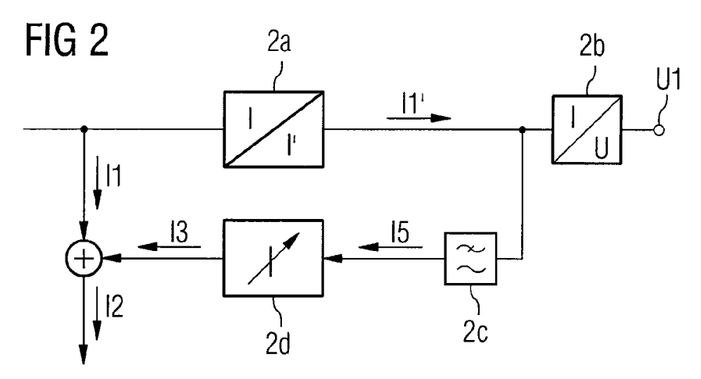
FIG. 2 shows a block diagram of an example implementation for reducing the dynamic range of an input current using a dynamic control loop.

In FIG. 2, a block diagram of an example of the implementation of the decoupling unit 2 is represented in more details. A linear current converter 2a is connected to a current/voltage converter 2b. A control feedback loop, comprising a low-pass filter 2c and a current regulator 2d, is also connected from the output of the current converter 2a through a summing node to the input of the current converter 2a.

The input current I1, consisting of a rapidly changing current together with a slowly changing current, is now present at the input to the linear current converter 2a. This current converter 2a transfers all the current components of the input current I1 linearly, yielding the auxiliary current I1' at its output. Due to the linear current conversion, both the slowly changing and the rapidly changing currents are present in the auxiliary current I1'. By means of the current/voltage converter 2b, an output signal U1, used for further processing of the information, is generated from the auxiliary current I1'. In addition to being passed to the current/voltage converter, the auxiliary current I1' is also fed back. The regulating variable in this control loop is that proportion of the auxiliary current I1' that contains the slowly changing current I5. The auxiliary current I1' is filtered in a low-pass filter 2c in such a way that only that component of the current that is changing slowly I5 is present at the output of the low-pass module. The current I5 is converted in a current regulation circuit 2d to yield the second auxiliary current I3. This auxiliary current I3 is also referred to as the feedback variable. By means of the constant current I2 the additive superimposition of the input current I1 with the auxiliary current I3 results in compensation for the slow changes.

Dynamic regulation is implemented here through components 2c and 2d in the form of a feedback control loop. The variable regulated in this control loop is the current I5, which only contains the slowly changing component in the input current. If the feedback control loop 2c and 2d is now formed in such a way that currents I3 and I1 are additively superimposed, so that the slower changes in the current are compensated, then an output voltage U1 will be present at the output of the current/voltage converter 2b which will be at one level, modulated with the information.

As a result of this constant output level, subsequent circuits operate independently of the slow changes in current, and therefore independently of the changing distance between the transmitting and receiving units of such a communication system.

Figure 3:
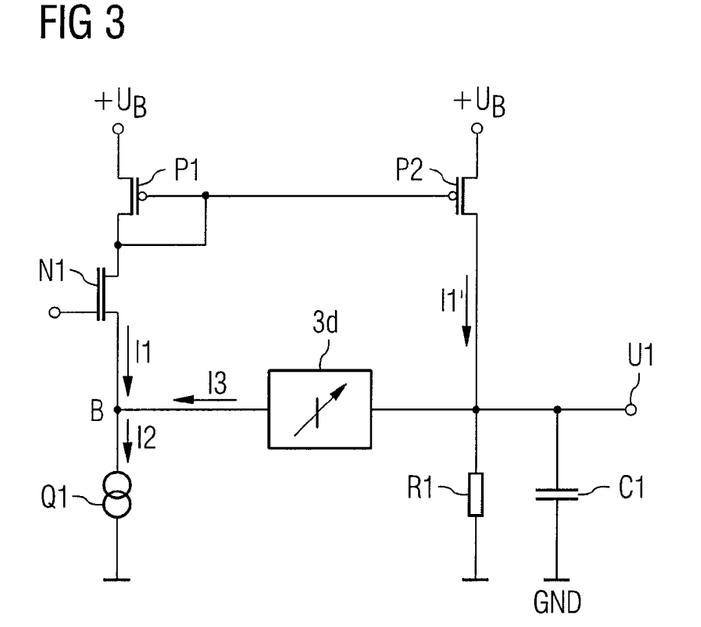
FIG. 3 shows a circuit diagram illustrating the principle of the example implementation.

FIG. 3 illustrates the general principles of a circuit according to the block diagram of FIG. 2. N-channel and P-channel transistors are used, each of which has a drain and a source connection in addition to a gate connection. N-channel transistors are given names beginning with an "N", while those for P-channel transistors begin with a "P". An input transistor N1, whose gate connection serves as the input and whose drain is connected to the source of transistor P1, is shown. The gate and source of transistor P1 are connected together, while its gate is also connected to transistor P2. The drains of both transistors and P1 and P2 are connected to a positive power supply voltage. The source of transistor P2 is also connected to a load resistor R1. The second terminal of the load resistor R1 is connected to the reference potential GND. A load capacitor C1 is connected in parallel with load resistor R1. The output voltage U1 is developed across resistor R1 and capacitor C1. The node where the output voltage U1 is developed is also connected to a current regulator 3d. The output of the current regulator 3d is, in turn, connected to the source of the input transistor N1. The current regulator 3d therefore forms a feedback loop. A constant current source Q1, also connected to the source of transistor N1, is connected at the other end to the reference potential GND.

The input transistor N1 passes the input current I1. Because transistors P1 and P2 form a current mirror, they convert current I1 into an auxiliary current I1'. The output voltage U1 developed across resistor R1 and capacitor C1 is generated by the auxiliary current I1'. It follows that R1 is an element that converts current to voltage. The purpose of capacitor C1 here is merely to filter out those high-frequency components of the voltage spectrum that make no significant contribution to the information content. The auxiliary current I1' is then converted into a second auxiliary current I3 with the aid of current regulator 3d. This is then additively combined with input current I1 in such a way that a constant current I2 is generated in the constant current source Q1.

Figure 4A:
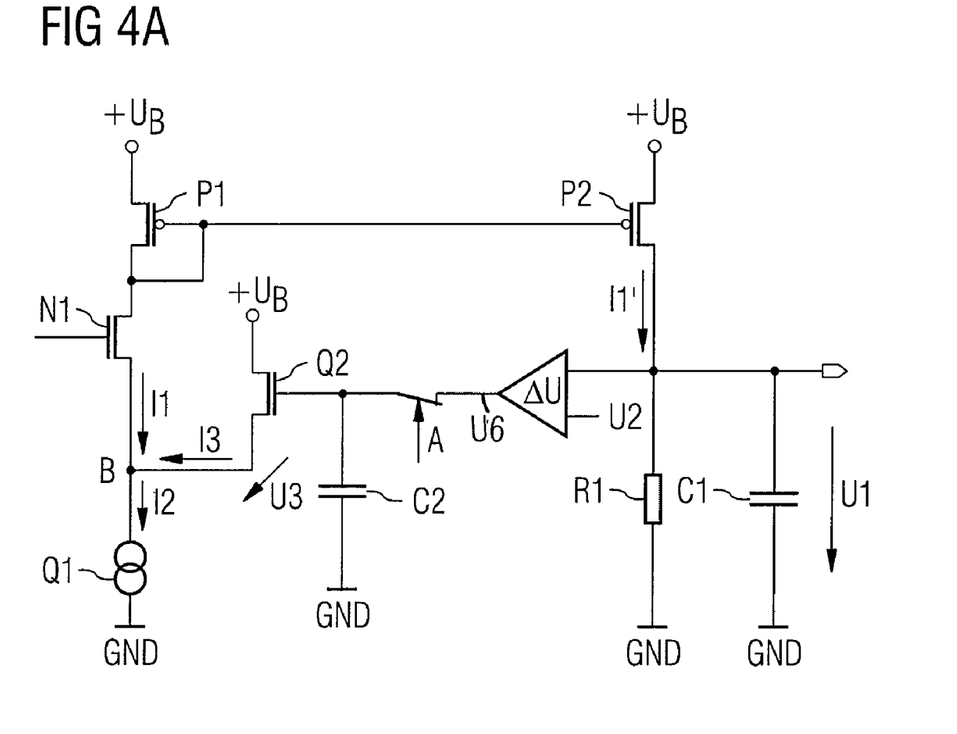
FIGS. 4a and 4b show first steps to realizing the example implementation.
Figure 4B:
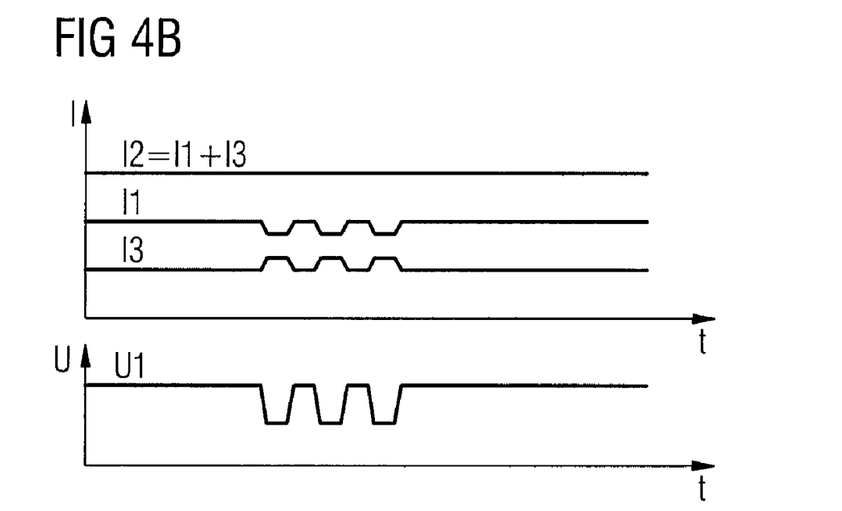

FIGS. 4a and 4b illustrate a first possible approach to realizing the example implementation, along with various curves of current and one of voltage against time t. As compared with FIG. 3, FIGS. 4a and 4b show the feedback loop in more detail. The other components described in relation to FIG. 3 are therefore retained, and connected in the same way.

In contrast to FIG. 3, the feedback loop in FIG. 4a is initially formed with the aid of a differential amplifier ΔU, whose first input is connected to the output voltage U1 and whose second input is connected to the reference voltage U2. The output of the differential amplifier is a difference voltage U6, and is connected to a sample-and-hold switch A. The output of the switch A is connected to a low-pass capacitor C2 and to the gate terminal of transistor Q2. The second terminal of capacitor C2 is in turn connected to the reference potential GND. The drain of transistor Q2 is connected to the positive power supply voltage, while its source is connected to input transistor N1.

In contrast to FIG. 3, the controlling feedback variable is initially the output voltage U1. This voltage U1 is compared with the reference voltage U2 by differential amplifier ΔU. The output of the differential amplifier ΔU is now at a difference voltage U6; this contains both a rapidly changing voltage and a slowly changing voltage, and depends on the difference between the voltages U1 and U2. Because the output is connected with low-pass capacitor C2, the slowly changing voltage component is separated from the rapidly changing voltage component. C2 effectively provides a short circuit for the rapid voltage changes. The slowly changing voltage is referred to from here on as U3, and at the same time provides a control voltage for control transistor Q2. The current I3 passed by control transistor Q2 as a result of the voltage U3 is, in turn, referred to as the second auxiliary current. Due to the constant current I2, a change in the current I1 will lead to I3 being additively superimposed on current I1 at current node B, compensating for the change. Slow changes in the current I1 will control current I3 through control transistor Q2 by means of its gate voltage U3. Fast changes in the current I1 will be directly controlled at this point by the source potential of transistor Q2. A relatively fast rise in current I1 causes a rise in the source potential of Q2. Since U3 only contains a slowly changing component, the gate potential of transistor Q2 remains the same, and the resulting gate-source voltage will therefore be smaller. This reduces the second auxiliary current I3, and compensates for fast changes in current I1 at current node B.

These relationships are clarified through the current and voltage curves of FIG. 4b. The compensation is achieved through the constant current I2 and through the additive superimposition of currents I1 and I3 at current node B. This illustrates the principle of how the feedback that has been described, and which generates current I3, does not affect the rapid changes in current. This achieves a constant output voltage level U1, which only varies if rapid changes in current at resistor R1 lead to rapid changes in voltage.

Figure 5:
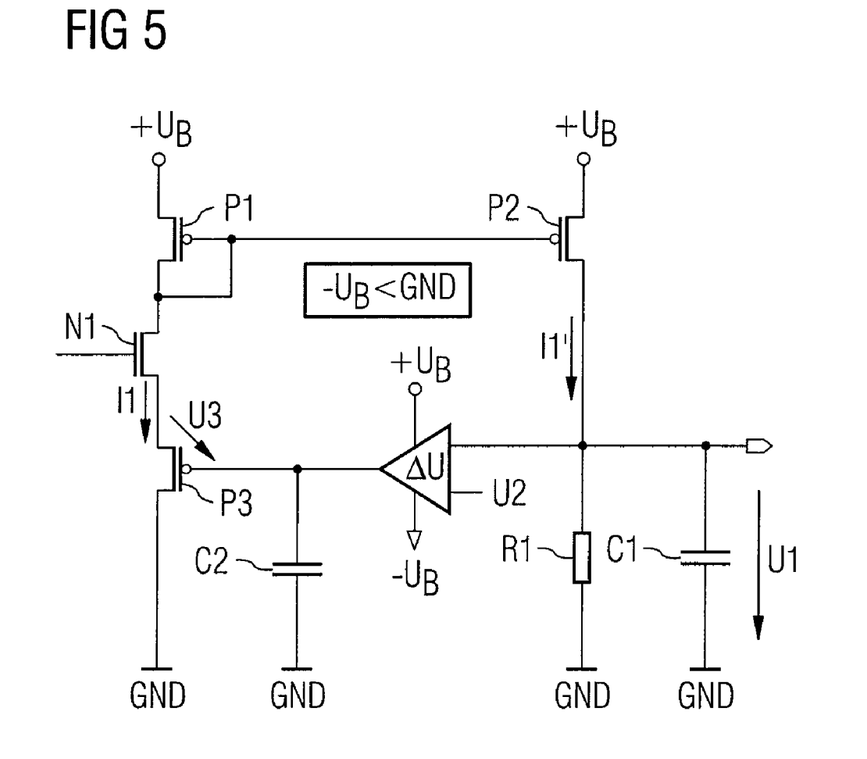
FIG. 5 shows further steps to realizing the example implementation.

FIG. 5 illustrates a further way of realizing the example implementation. Because the two examples are similar, only the differences between FIGS. 4a and 4b, and FIG. 5 will be described below.

The difference as compared with FIGS. 4a and 4b is that the output of the differential amplifier ΔU is connected to the gate of transistor P3. The source of this transistor is connected to input transistor N1, while its drain is connected to the reference potential GND. The constant current source Q1 is omitted from FIG. 5. The differential amplifier, furthermore, is operated from both a positive supply +UB and a negative supply −UB, because the voltage including the slow changes in voltage U3 has a negative arithmetic sign.

Because the variable current source Q2 is replaced by transistor P3, it is necessary for the difference voltage U6 in the feedback loop also to be able to adopt negative values. For this reason, the differential amplifier ΔU, in contrast to FIGS. 4a and 4b, is also supplied with a negative power supply voltage. This enables the gate-source voltage of U3 to have a more negative voltage than the source terminal of the input transistor N1. This voltage U3 regulates the current I1. The constant current I2 is developed here in transistor P3, and is not shown here.

The two possible implementations illustrated in FIGS. 4a and 4b, and FIG. 5, incorporate an optional sample-and-hold function. Switch A, which opens or closes when operated, permits the regulation loop to be interrupted briefly, thereby allowing output voltage U1 to be sampled in a more controlled way.

Figure 6:
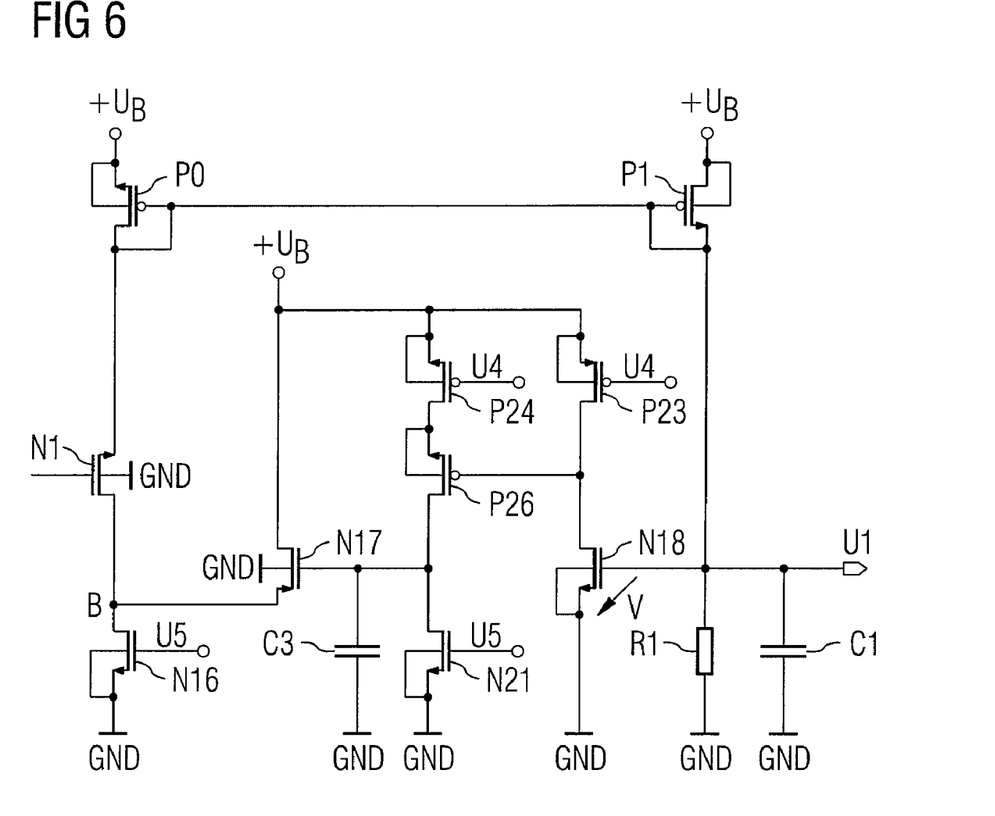
FIG. 6 shows a circuit diagram of the example implementation.

A circuit diagram of the example implementation is shown in FIG. 6. This circuit diagram corresponds substantially to the foregoing illustrations.

The difference from the foregoing figures consists primarily of some transistor references. The current mirror transistors are referred to in FIG. 6 as P0 and P1, the constant current source, implemented as a transistor, is referred to as N16, the variable current source as N17, and the low-pass capacitor is labelled C3.

The feedback loop also has a different structure. In FIG. 6, the output voltage level U1 is applied to the gate of transistor N18. The source of N18 is connected to the reference potential, its drain to the source of transistor P23 and to the gate of transistor P26. The source of P26 is in turn connected to the drain of N21, and its drain to the source of transistor P24. The drains of P24 and P23 are connected to the positive reference potential GND +UB. The drain of N21 is also connected to low-pass capacitor C3 and to the gate of control transistor N17. The second terminal of C3 is connected to the reference potential GND. The drain terminal of N17 is connected to the positive reference potential GND, while the source of the transistor is connected to the drain of transistor N16. The gates of N21 and N16 are connected to the N-channel bias voltage U4, whereas the gates of P23 and P24 are connected to the P-channel bias voltage U5.

The output voltage level U1 is then set to a voltage through transistor N18. This static sensor output voltage charges or discharges the low-pass capacitor C3 through the current-controlled inverter consisting of transistors P24, P26 and N24. This inverter is biased by the N-channel or P-channel bias voltages U4 and U5. The voltage dropped across C3 controls the second auxiliary current I3, and this flows to the source terminal of input transistor N1. The constant current source, implemented in transistor N16, which is also biased by bias voltage U5, carries the additively superimposed constant current I2 in the drain-source channel, consisting of the input current I1 and the second auxiliary current I3.

Figure 7:
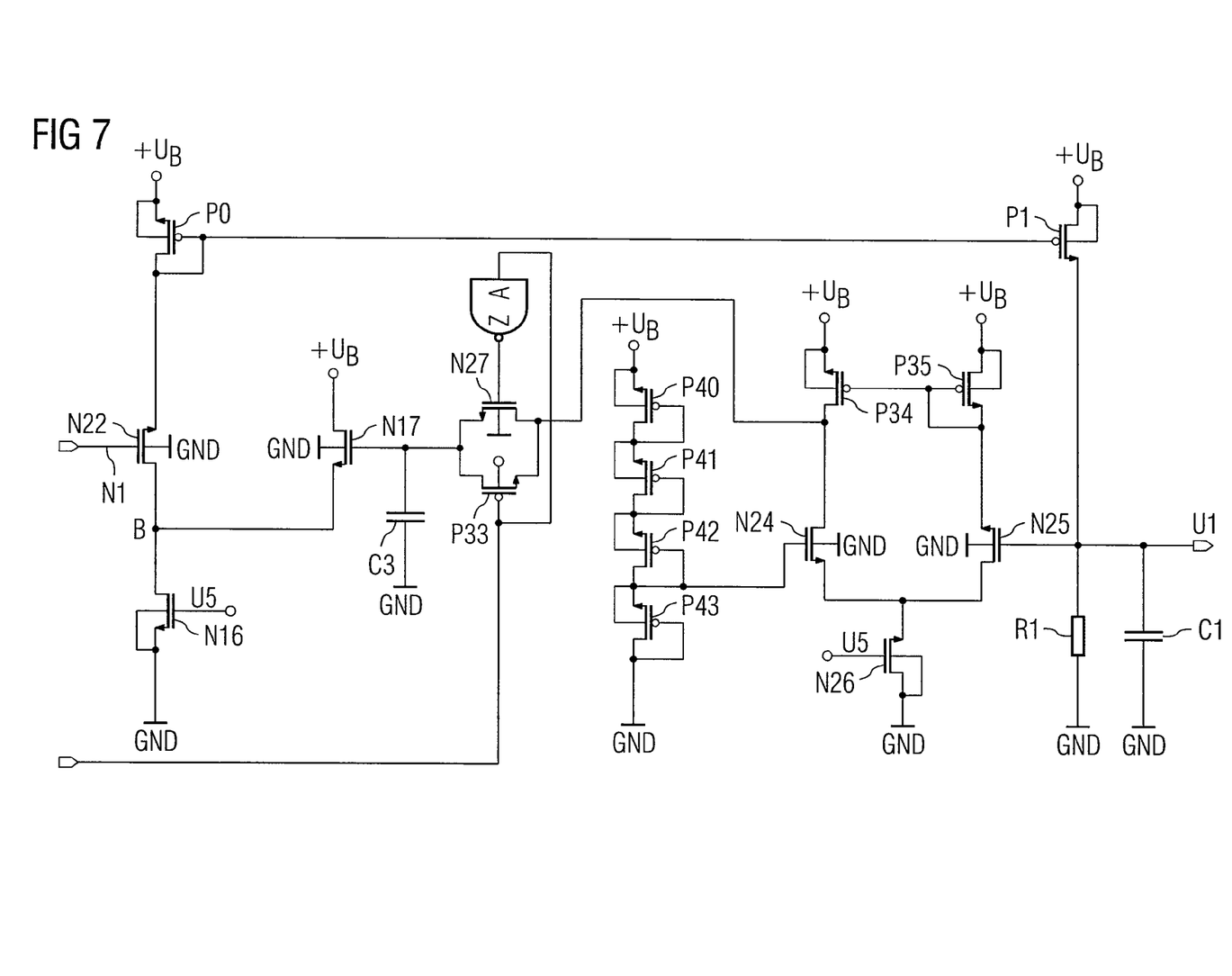
FIG. 7 shows extended circuit diagram of the example implementation, including differential amplifier, reference voltage and sample-and-hold function

FIG. 7 shows a more detailed circuit of the example implementation, and differs from the circuit of FIG. 6 in the following ways. It contains the differential amplifier ΔU described for the possible implementations, a reference voltage source that generates reference voltage U2, and the sample-and-hold switch A in the feedback loop.

The output voltage U1 is connected to the gate of transistor N25 for this reason. The drain of N25 is connected to the gate and source terminals of transistor P35. Its source, however, is connected to the source terminal of transistor N24 and the drain of N26. Similarly, the drain of N24 is connected to the source of P34. The gate of P34 has a connection to the gate of P35. The drains of P34 and P35 are connected to the positive power supply voltage. The gate terminal of N24 is joined to the gate and source terminals of P42 and to the drain of P43. The gate and source of P43 are at the reference potential GND. The drain of P42 is joined to the gate and source of P41. The drain of P41 is joined to the gate and source of P40. The drain of P40 is at the positive operating potential. The drain of N24 is connected to the drain of N27 and to the drain of P33. The gate of N27 is connected to the output of an inverter, while the gate of P33, on the other hand, is connected to the input of the inverter. The input to the inverter is labelled "HOLD", and represents a voltage input. The sources of P33 and N27 are connected to the low-pass capacitor C3. From this point on, the feedback loop matches that shown in FIG. 6.

The output voltage U1 is compared with the reference voltage U2 by a differential amplifier ΔU, consisting of N24 and N25. The output voltage U1 is therefore present at the input transistor N25 of the differential amplifier ΔU. The differential amplifier ΔU is loaded by a current mirror, consisting of P34 and P35, and is supplied with operating current through transistor N26, which is biased by voltage U5. The second input of the differential amplifier ΔU, which corresponds to the gate terminal of transistor N24, is fed from the reference voltage U2. This voltage U2 is obtained from a reference voltage source consisting of a series connection of transistors P40, P41, P42 and P43, tapped at the source terminal of transistor P42. This series circuit therefore comprises a potential divider, configured in such a way that the reference voltage level U2 is approximately 400 mV. The resulting output voltage from the differential amplifier U6 is now available at the drain terminal of transistor N24. This terminal is connected to the CMOS switch illustrated, consisting of P33 and N27. The CMOS switch thereby implements the sample-and-hold switch A. The switch A is driven by the inverter. When the "Hold" input is held high, the switch consisting of P33 and N27 is conductive, passing the difference voltage signal U6 to capacitor C3.

On the basis of the fact that the electrical current converted, referred to below as the input current, consists of a rapidly changing component and a slowly changing component, this invention provides equipment and a method for reducing the dynamic range. Because the information is only contained in the rapidly changing current component, the slow changes in current are compensated by means of a dynamic control loop. The control loop is designed in such a way that the working point of this control loop does not change in response to fast changes in the current. This results in data transmission that is independent of slow changes in current; in other words, it does not depend on the field strength and therefore not on the distance between the transmitting and receiving units, and provides the data with a constant level of output current.

What is claimed is:

1. An arrangement comprising:
   a first converting element configured to convert an input current linearly into an auxiliary current;
   a second converting element configured to convert the auxiliary current into an output voltage; and
   a separating element configured to separate slow changes of the auxiliary current from fast changes of the auxiliary current,
   wherein the first, second, and separating elements are arranged as a dynamic control loop regulating the input current with the slow changes, and
   wherein the output voltage is dependent on the fast changes of the auxiliary current.

2. The arrangement according to claim 1, wherein the control loop comprises a feedback from the output of the first converting element to the input of the first converting element.

3. The arrangement according to claim 2, wherein the feedback comprises the separating element and a current regulating element.

4. The arrangement according to claim 3, wherein the current regulating element exclusively uses the slow changes of the auxiliary current as a controlling feedback variable for regulating the current.

5. The arrangement according to claim 4, wherein the current regulating element generates a second auxiliary current which is added to the input current.

6. The arrangement according to claim 5, wherein the first converting element comprises a current mirror circuit.

7. The arrangement according to claim 5, wherein the output voltage is used as the controlling feedback variable.

8. The arrangement according to claim 7, wherein the output voltage is compared with a constant reference voltage by a third converting element and the result is output as a difference voltage.

9. The arrangement according to claim 8, wherein the third converting element comprises a differential amplifier.

10. The arrangement according to claim 8, wherein the difference voltage is converted by a fourth converting element into a second auxiliary current.

11. The arrangement according to claim 10, wherein the fourth converting element comprises a voltage-controlled current source.

12. The arrangement according to claim 11, wherein the voltage-controlled current source is realized by at least one transistor.

13. The arrangement according to claim 10, wherein the addition of the input current and the second auxiliary current generates a constant current.

14. The arrangement according to claim 1, wherein the arrangement is a receiver in a communication system.

15. The arrangement according to claim 14, wherein the arrangement is a receiver in an RFID system.

16. A method for controlling an input current comprising:
converting an input current into a first auxiliary current;
converting the auxiliary current into an output voltage; and
dynamically regulating the input current according to a slow changing component of the first auxiliary current,
wherein the output voltage is dependent on a rapidly changing component of the auxiliary current.

17. The method according to claim 16, wherein the step of dynamically regulating comprises separating the slowly changing component of the first auxiliary current from the rapidly changing component.

18. The method according to claim 17, further comprising using the first auxiliary current with the slowly changing component of the first auxiliary current as a regulating variable.

19. The method according to claim 18, further comprising using a second auxiliary current of the slowly changing component of the first auxiliary current as a controlling feedback variable.

20. The method according to claim 18, further comprising adding the controlling feedback variable to the input current.

21. The method according to claim 19, wherein the output voltage has a level which is held within a defined range of voltage levels.

22. The method according to claim 18, further comprising generating the second auxiliary current by converting a difference between the output voltage and a reference voltage into the second auxiliary current.

23. The method according to claim 22, wherein the addition of the input current and the second auxiliary current generates a constant current.

24. An input current controller arrangement comprising:
a converting element configured to convert an input current to a first auxiliary current, wherein the input current includes a slowly changing component and a rapidly changing component, and the slowly changing current component has a wide dynamic range of values requiring compensation;
a current to voltage converting element configured to generate an output voltage from the first auxiliary current, wherein the output voltage has a voltage level that constantly remains within defined limits; and
a dynamic control loop, which comprises:
an element configured to convert the first auxiliary current into a component that changes slowly and a component that changes rapidly; and
a current control element configured to regulate the slowly changing component of the first auxiliary current,
wherein the output voltage is dependent on the component that changes rapidly.

25. The arrangement according to claim 24, wherein the first auxiliary current is used as a regulating variable, and a second auxiliary current, which is generated by the current regulating element, is used as a controlling feedback variable.

26. The arrangement according to claim 25, wherein the output voltage is used as the regulating variable, and the control loop comprises a voltage to current converting element.

27. The arrangement according to claim 26, wherein the second auxiliary current is additively superimposed onto the input current, and compensates for the dynamic range.

28. An arrangement comprising:
a first converting means for converting an input current linearly into an auxiliary current;
a second converting means for converting the auxiliary current into an output voltage; and
a separating means for separating slow changes of the auxiliary current from fast changes of the auxiliary current,
wherein the first, second, and separating means are arranged as a dynamic control loop regulating the input current with the slow changes, and
wherein the output voltage is dependent on the fast changes of the auxiliary current.

* * * * *